(12) United States Patent
Hsieh

(10) Patent No.: US 8,569,765 B2
(45) Date of Patent: *Oct. 29, 2013

(54) MOSFET-SCHOTTKY RECTIFIER-DIODE INTEGRATED CIRCUITS WITH TRENCH CONTACT STRUCTURES

(75) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 217 days.

This patent is subject to a terminal disclaimer.

(21) Appl. No.: 13/186,619

(22) Filed: Jul. 20, 2011

(65) Prior Publication Data

US 2013/0020577 A1    Jan. 24, 2013

(51) Int. Cl.
*H01L 27/06*    (2006.01)

(52) U.S. Cl.
USPC .................... 257/66; 257/334; 257/E27.016

(58) Field of Classification Search
USPC ..................... 257/66, E27.016, 334
See application file for complete search history.

(56) References Cited

U.S. PATENT DOCUMENTS

2013/0020576 A1 *    1/2013   Hsieh ............................. 257/66

\* cited by examiner

*Primary Examiner* — Roy Potter
(74) *Attorney, Agent, or Firm* — Bacon & Thomas, PLLC

(57) ABSTRACT

A trench MOSFET device with embedded Schottky rectifier, Gate-Drain and Gate-Source clamp diodes on single chip is formed to achieve device shrinkage and performance improvement. The present semiconductor devices achieve low Vf and reverse leakage current for embedded Schottky rectifier, have overvoltage protection for Gate-Source clamp diode and avalanche protection for Gate-Drain clamp diode.

30 Claims, 11 Drawing Sheets

MOSFET-SCHOTTKY RECTIFIER-DIODE INTEGRATED CIRCUITS WITH TRENCH CONTACT STRUCTURES

FIELD OF THE INVENTION

This invention relates generally to the cell structure, device configuration and fabrication process of power semiconductor devices. More particularly, this invention relates to an improved cell configuration to manufacture trench MOSFET device with Schottky rectifier, Gate-Drain (GD) and Gate-Source (GS) clamp diodes on single chip for device shrinkage and performance improvement.

BACKGROUND OF THE INVENTION

As shown in FIG. 1, normally for high efficiency DC/DC application, a Schottky rectifier is externally added in parallel with a MOSFET device to prevent a parasitic P/N body diode in the MOSFET from turning on in order to achieve higher speed and efficiency. The requirement for the clamping effect is that forward voltage of the Schottky rectifier Vf is less than the parasitic body PN diode (~0.7V). Besides the Schottky rectifier, a Gate-Source clamp diode with a breakdown voltage lower than gate oxide rupture voltage of the MOSFET is provided for gate oxide ESD (electrostatic discharge) protection. Moreover, a Gate-Drain clamp diode with a breakdown voltage lower than that of the MOSFET is provided for Drain-Source avalanche protection. However, assembly of those separate structures into single package with extra interconnection wires results in higher manufacturing cost, and poor performance due to increase in inductance from the extra interconnection wires.

Accordingly, it would be desirable to provide more integrated trench MOSFET device with embedded Schottky rectifier, Gate-Drain and Gate-Source clamp diodes on single chip for device shrinkage and performance improvement.

SUMMARY OF THE INVENTION

It is therefore an aspect of the present invention to provide improved semiconductor power device configuration for providing a trench MOSFET device with embedded Schottky rectifier, Gate-Drain and Gate-Source clamp diodes on single chip so that space occupied can be reduced, and performance can be further improved According to the present invention, there is provided an integrated circuit comprises: a substrate of a first conductivity type; an epitaxial layer of the first conductivity type over the substrate, the epitaxial layer having a lower doping concentration than the substrate; a trench MOSFET comprising a plurality of trenched gates surrounded by a source region of the first conductivity type encompassed in a body region of a second conductivity type; each the trenched gate comprising a conductive material padded by a gate oxide layer filled in a gate trench, wherein the gate oxide layer having a thick bottom oxide on bottom surface of the gate trench with a thickness greater than sidewall oxide along sidewall of the gate trench; a Schottky rectifier extending into the epitaxial layer and having a Schottky barrier layer lined in a trenched anode contact filled with a contact metal plug; a Gate-Drain clamp diode comprising multiple back to back poly-silicon Zener diodes with alternating doped regions of the first conductivity type next to the second conductivity type, connected with a gate metal on one side, and with a drain metal on another side through a plurality of metal stripes cross over a termination area; and a Gate-Source clamp diode comprising multiple back to back poly-silicon Zener diodes with alternating doped regions of the first conductivity type next to the second conductivity type, connected with the gate metal on one side, and with a source metal on another side.

It is therefore another aspect of the present invention to provide improved semiconductor power device configuration for providing a trench MOSFET device with embedded Schottky rectifier, and Gate-Source clamp diode on single chip so that space occupied can be reduced, and performance can be further improved According to the present invention, there is provided an integrated circuit comprises: a substrate of a first conductivity type; an epitaxial layer of the first conductivity type over the substrate, the epitaxial layer having a lower doping concentration than the substrate; a trench MOSFET comprising a plurality of trenched gates surrounded by a source region of the first conductivity type encompassed in a body region of a second conductivity type; each the trenched gate comprising a conductive material padded by a gate oxide layer filled in a gate trench, wherein the gate oxide layer having a thick bottom oxide on bottom surface of the gate trench with a thickness greater than sidewall oxide along sidewall of the gate trench; a Schottky rectifier extending into the epitaxial layer and having a Schottky barrier layer lined in a trenched anode contact filled with a contact metal plug; and a Gate-Source clamp diode comprising multiple back to back poly-silicon Zener diodes with alternating doped regions of the first conductivity type next to the second conductivity type, connected with a gate metal on one side, and with a source metal on another side.

It is therefore another aspect of the present invention to provide improved semiconductor power device configuration for providing a trench MOSFET device with embedded Schottky rectifier, and Gate-Drain clamp diode on single chip so that space occupied can be reduced, and performance can be further improved According to the present invention, there is provided an integrated circuit comprises: a substrate of a first conductivity type; an epitaxial layer of the first conductivity type over the substrate, the epitaxial layer having a lower doping concentration than the substrate; a trench MOSFET comprising a plurality of trenched gates surrounded by a source region of the first conductivity type encompassed in a body region of a second conductivity type; each the trenched gate comprising a conductive material padded by a gate oxide layer filled in a gate trench, wherein the gate oxide layer having a thick bottom oxide on bottom surface of the gate trench with a thickness greater than sidewall oxide along sidewall of the gate trench; a Schottky rectifier extending into the epitaxial layer and having a Schottky barrier layer lined in a trenched anode contact filled with a contact metal plug; and a Gate-Drain clamp diode comprising multiple back to back poly-silicon Zener diodes with alternating doped regions of the first conductivity type next to the second conductivity type, connected with a gate metal on one side, and with a drain metal on another side through a plurality of metal stripes cross over a termination area.

It is therefore another aspect of the present invention to provide improved semiconductor power device configuration for providing a trench MOSFET device with Gate-Drain and Gate-Source clamp diodes on single chip so that space occupied can be reduced, and performance can be further improved According to the present invention, there is provided an integrated circuit comprises: a substrate of a first conductivity type; an epitaxial layer of the first conductivity type over the substrate, the epitaxial layer having a lower doping concentration than the substrate; a trench MOSFET comprising a plurality of trenched gates surrounded by a source region of the first conductivity type encompassed in a body region of a second conductivity type; each the trenched gate comprising a conductive material padded by a gate oxide layer filled in a gate trench, wherein the gate oxide layer having a thick bottom oxide on bottom surface of the gate trench with a thickness greater than sidewall oxide along sidewall of the gate trench; a Gate-Drain clamp diode comprising multiple back to back poly-silicon Zener diodes with alternating doped regions of the first conductivity type next to the second conductivity type, connected with a gate metal on one side, and with a drain metal on another side through a plurality of metal stripes cross over a termination area; and a Gate-Source clamp diode comprising multiple back to back poly-silicon Zener diodes with alternating doped regions of the first conductivity type next to the second conductivity type, connected with the gate metal on one side, and with a source metal on another side.

It is therefore another aspect of the present invention to provide improved semiconductor power device configuration for providing a trench MOSFET device with Gate-Source clamp diode on single chip so that space occupied can be reduced, and performance can be further improved According to the present invention, there is provided an integrated circuit comprises: a substrate of a first conductivity type; an epitaxial layer of the first conductivity type over the substrate, the epitaxial layer having a lower doping concentration than the substrate; a trench MOSFET comprising a plurality of trenched gates surrounded by a source region of the first conductivity type encompassed in a body region of a second conductivity type; each the trenched gate comprising a conductive material padded by a gate oxide layer filled in a gate trench, wherein the gate oxide layer having a thick bottom oxide on bottom surface of the gate trench with a thickness greater than sidewall oxide along sidewall of the gate trench; and a Gate-Source clamp diode comprising multiple back to back poly-silicon Zener diodes with alternating doped regions of the first conductivity type next to the second conductivity type, connected with a gate metal on one side, and with a source metal on another side.

It is therefore another aspect of the present invention to provide improved semiconductor power device configuration for providing a trench MOSFET device with Gate-Drain clamp diode on single chip so that space occupied can be reduced, and performance can be further improved According to the present invention, there is provided an integrated circuit comprises: a substrate of a first conductivity type; an epitaxial layer of the first conductivity type over the substrate, the epitaxial layer having a lower doping concentration than the substrate; a trench MOSFET comprising a plurality of trenched gates surrounded by a source region of the first conductivity type encompassed in a body region of a second conductivity type; each the trenched gate comprising a conductive material padded by a gate oxide layer filled in a gate trench, wherein the gate oxide layer having a thick bottom oxide on bottom surface of the gate trench with a thickness greater than sidewall oxide along sidewall of the gate trench; and a Gate-Drain clamp diode comprising multiple back to back poly-silicon Zener diodes with alternating doped regions of the first conductivity type next to the second conductivity type, connected with a gate metal on one side, and with a drain metal on another side through a plurality of metal stripes cross over a termination area.

Some preferred embodiments include one or more detail features as followed: the Schottky rectifier is a trench Schottky rectifier having a Schottky barrier layer lined in the trenched anode contact filled with the contact metal plug and between a pair of adjacent the gate trenches; the Schottky rectifier is a Junction barrier Schottky rectifier having a Schottky barrier layer lined in the trenched anode contact filled with the contact metal plug and between a pair of adjacent the body regions; the Schottky rectifier further comprises a Schottky barrier height enhancement region of the first conductivity type surrounding sidewalls and bottom of each the trenched anode contact in the epitaxial layer, the Schottky barrier height enhancement region having a doping concentration lower than the epitaxial layer; the Schottky rectifier further comprises a Schottky barrier height enhancement region of the second conductivity type surrounding sidewalls and bottom of each the trenched anode contact in the epitaxial layer; the Gate-Source clamp diode is connected to the source metal through a first trenched diode contact filled with the contact metal plug and connected to the gate metal through a second trenched diode contact filled with the contact metal plug; the Gate-Drain clamp diode is connected to the gate metal through a third trenched diode contact filled with the contact metal plug and connected to the drain metal through a forth trenched diode contact filled with the contact metal plug; the integrated circuit further comprises an etch-buffer trenched gate in the epitaxial layer and underneath each of the first, second, third and forth trenched diode contacts, the etch-buffer trenched gate having same structure of the trenched gate in the trench MOSFET and serving as buffer layer for prevention of gate-body shortage.

These and other objects and advantages of the present invention will no doubt become obvious to those of ordinary skill in the art after having read the following detailed description of the preferred embodiment, which is illustrated in the various drawing figures.

DETAILED DESCRIPTION OF THE EMBODIMENTS

Figure 1:
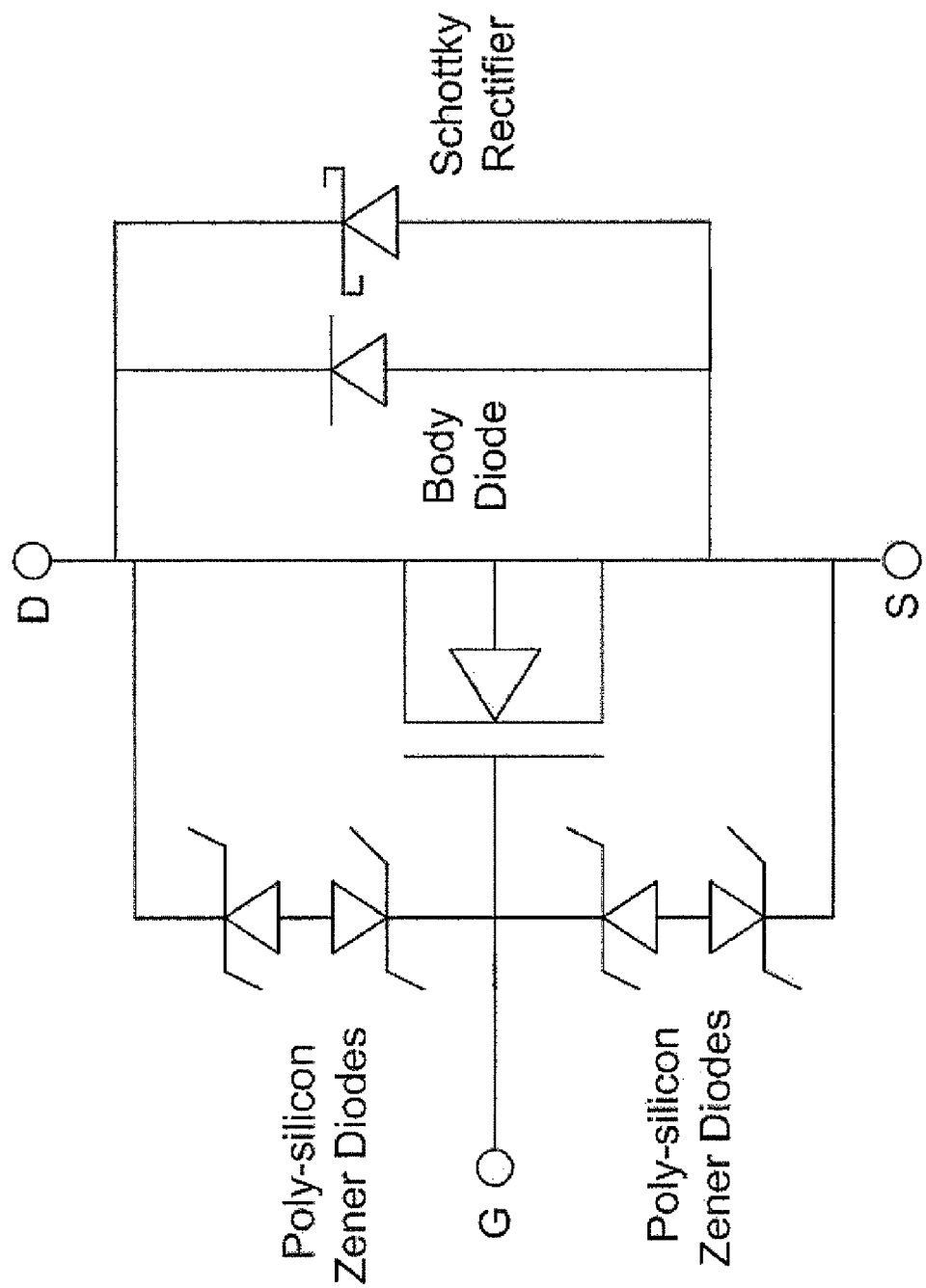
FIG. 1 shows a conventional application circuit of the MOSFET power device with integration of Schottky rectifier, Gate-Drain and Gate-Source clamp diodes in single package.
Figure 2A:
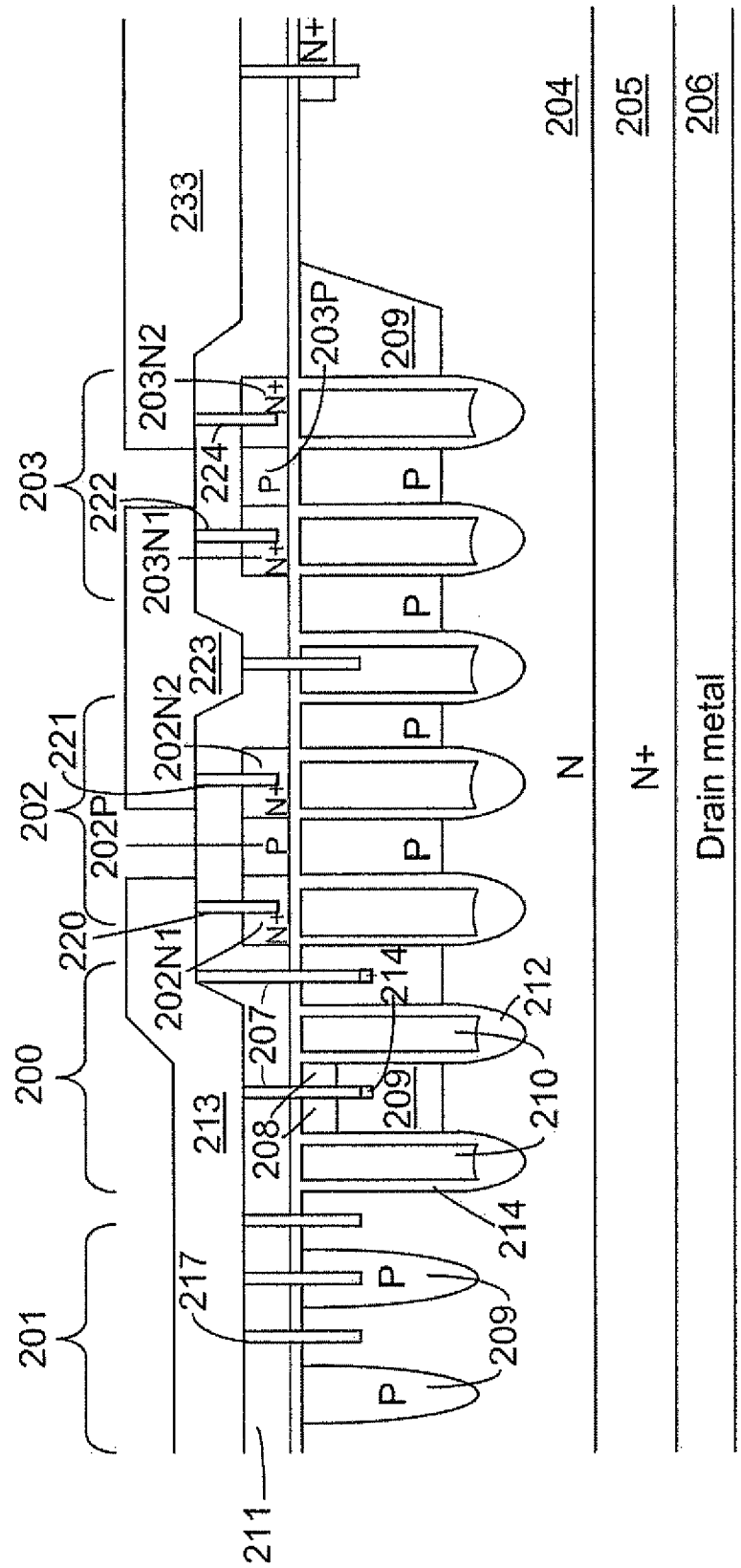
FIG. 2A is a preferred A-B cross-section view of FIG. 2C according to the present invention.
Figure 2B:
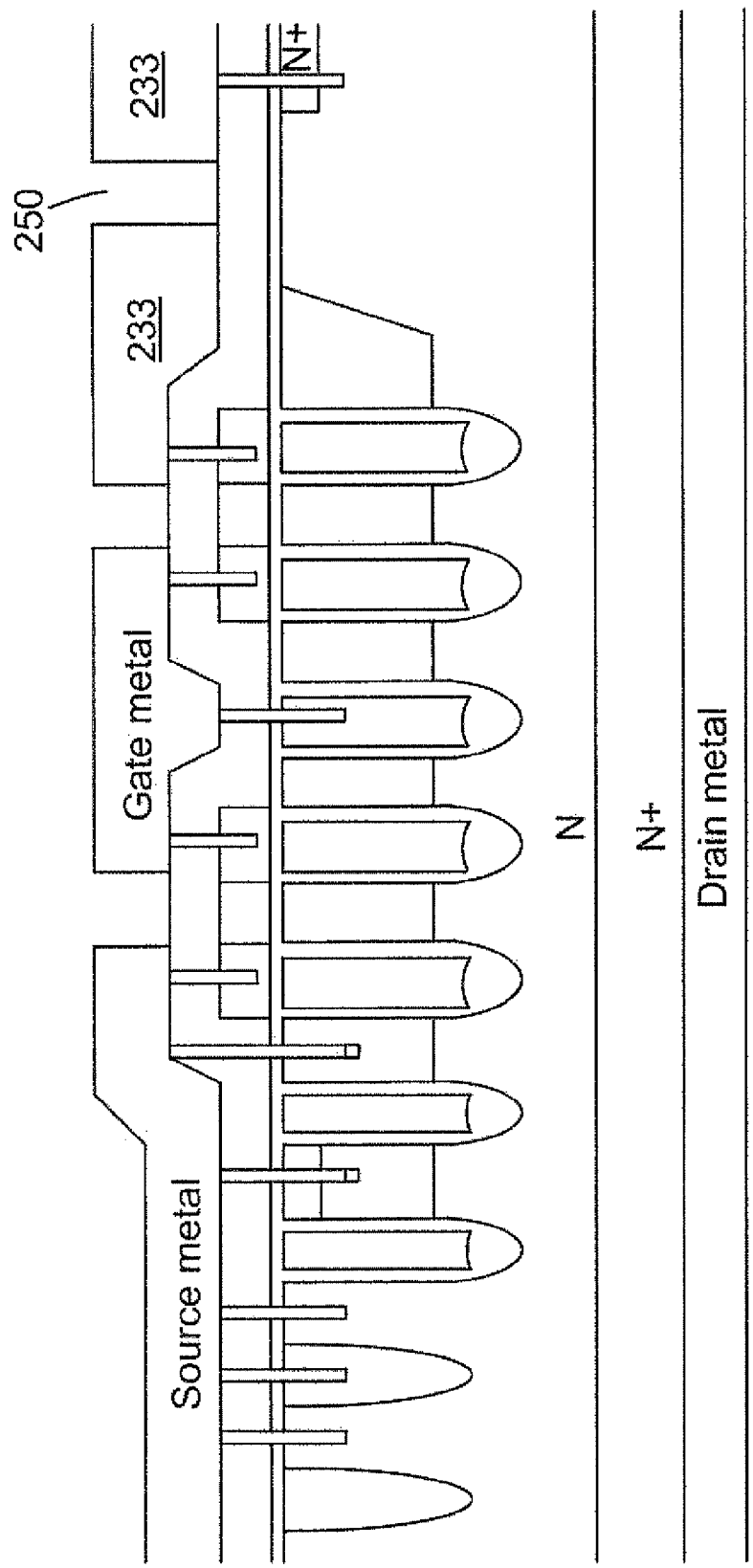
FIG. 2B is a preferred C-D cross-section view of FIG. 2C according to the present invention.

Please refer to FIG. 2A to 2B for a preferred embodiment of this invention. FIG. 2A is a preferred A-B cross-section view of FIG. 2C which shows a trench MOSFET 200 implemented with Junction Barrier Schottky rectifier 201, a Gate-Source clamp diode 202 and a Gate-Drain clamp diode 203 formed in an N epitaxial layer 204 above a heavily doped N+ substrate 205 coated with back metal of Ti/Ni/Ag on rear side as a drain metal 206. In the trench MOSFET 200, a plurality of gate trenches are etched in the N epitaxial layer 204, each of the gate trench is filled with conductive material 210 padded by a gate oxide layer, wherein the gate oxide layer has a thick bottom oxide 212 on bottom surface of the gate trench having a thickness greater than the sidewall oxide 214 along sidewall of the gate trench. P-body regions 209 are formed in the Junction Barrier Schottky rectifier 201 and extending between the gate trenches with a layer of source region 208 near the top surface of the P-body regions 209 in the portion of the trench MOSFET 200. Trenched source-body contacts 207 filled with contact metal plug, for example, tungsten plug, are implemented through an oxide contact interlayer 211 and into the N epitaxial layer 204. A layer of Al Alloys or Copper serves as a source metal 213 on the contact interlayer 211. A P body contact region 214 is formed surrounding bottom of each the trenched source-body contact 207 to reduce contact resistance between the trenched source-body contact 207 and the P body region 209. The Junction Barrier Schottky rectifier 201 has a Schottky barrier layer lined in a trenched anode contact 217 filled with the contact metal plug and between a pair of adjacent the P body regions 209. In order to provide the Gate-Source clamp diode 202 and the Gate-Drain clamp diode 203, a poly-silicon layer are formed on the contact interlayer 212 and doped as alternating N+ and P+ regions adjacent to each other. The N+ doped poly-silicon regions 202N1, 202N2 and the P+ doped poly-silicon region 202P constitute the Gate-Source clamp diode 202 while the N+ doped poly-silicon regions 203N1, 203N2 and the P+ doped poly-silicon region 203P constitute the Gate-Drain clamp diode 203.

A first trenched diode contact 220 filled with the contact metal plug is formed to connect the N+ doped poly-silicon region 202N1 of the Gate-Source clamp diode 202 to the source metal 213. A second trenched diode contact 221 filled with the contact metal plug is formed to connect the N+ doped poly-silicon region 202N2 of the Gate-Source clamp diode 202 to a gate metal 223. A third trenched diode contact 222 filled with the contact metal plug is formed to connect the N+ doped poly-silicon region 203N1 of the Gate-Drain clamp diode 203 to the gate metal 223. And a forth trenched diode contact 224 filled with the contact metal plug is formed to connect the N+ doped poly-silicon region 203N2 of the Gate-Drain clamp diode 203 to a metal stripe 233 which acts as metal field plate of a termination area and is finally connected to the drain metal 206. An Etch-buffer trenched gates having same structure as the trenched gates in the trench MOSFET is formed underneath each of the first, second, third and forth trenched diode contacts 220, 221, 222 and 224 to act as buffer layers to avoid gate-body shortage.

Figure 2C:
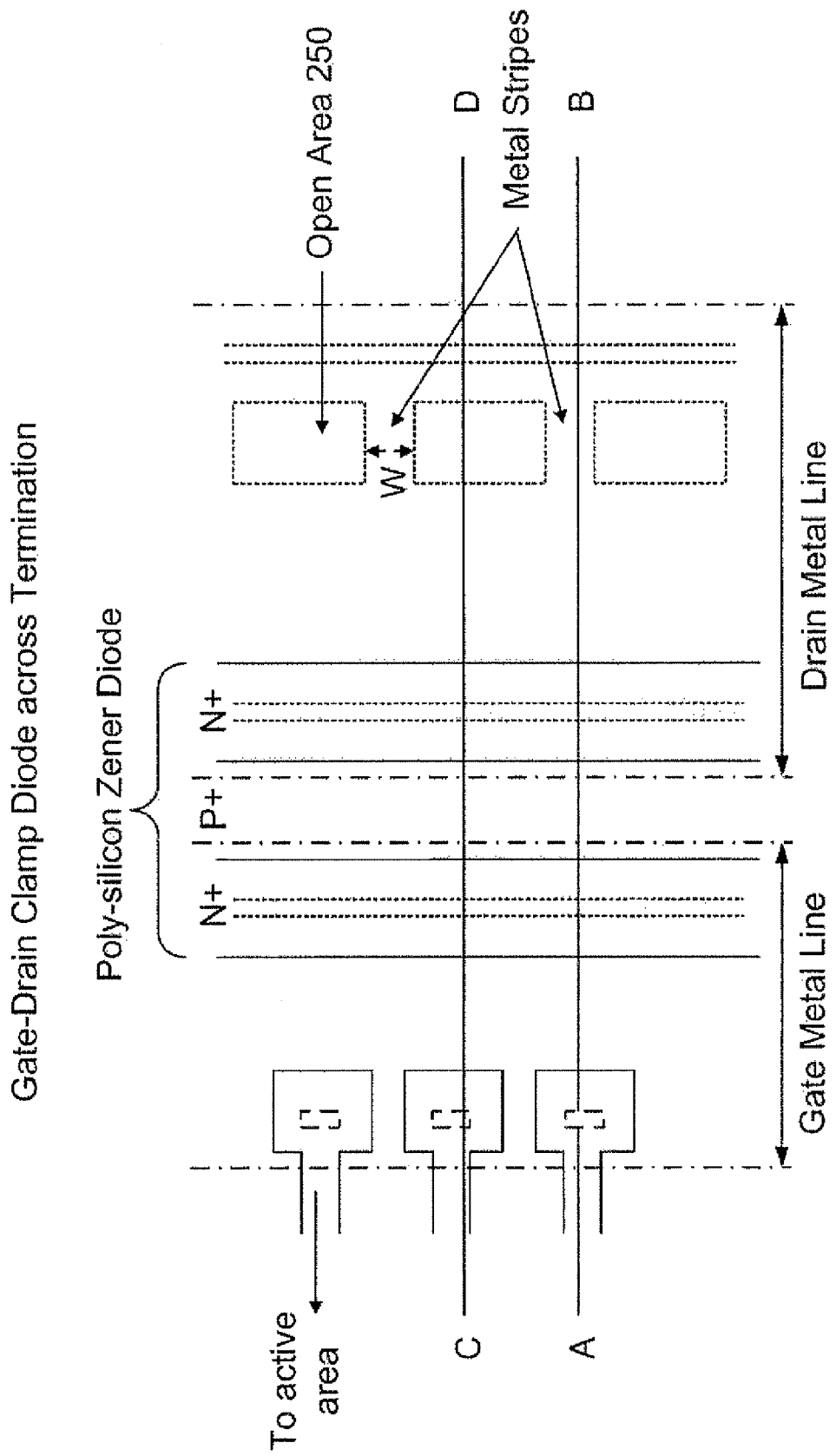
FIG. 2C is a top view of a preferred embodiment showing integrated trench MOSFET with embedded Schottky rectifier, Gate-Drain and Gate-Source clamp diodes.

FIG. 2B is a preferred C-D cross-section view of FIG. 2C. The only difference between FIG. 2B and FIG. 2A is that there is an open area 250 of the metal stripes 233 on the top of the termination area. A conventional metal field plate in the termination is provided to sustain breakdown voltage.

FIG. 2C is a top view of a preferred embodiment which shows Gate-Drain clamp diode across the termination area with the open areas 250 of a plurality of metal stripes with a metal width W. These open areas 250 allow electrical field come out there from during avalanche, and thus make benefits to avoid avalanche degradation caused by the metal field plate cross over the termination area as shown in FIG. 2A.

Figure 3:
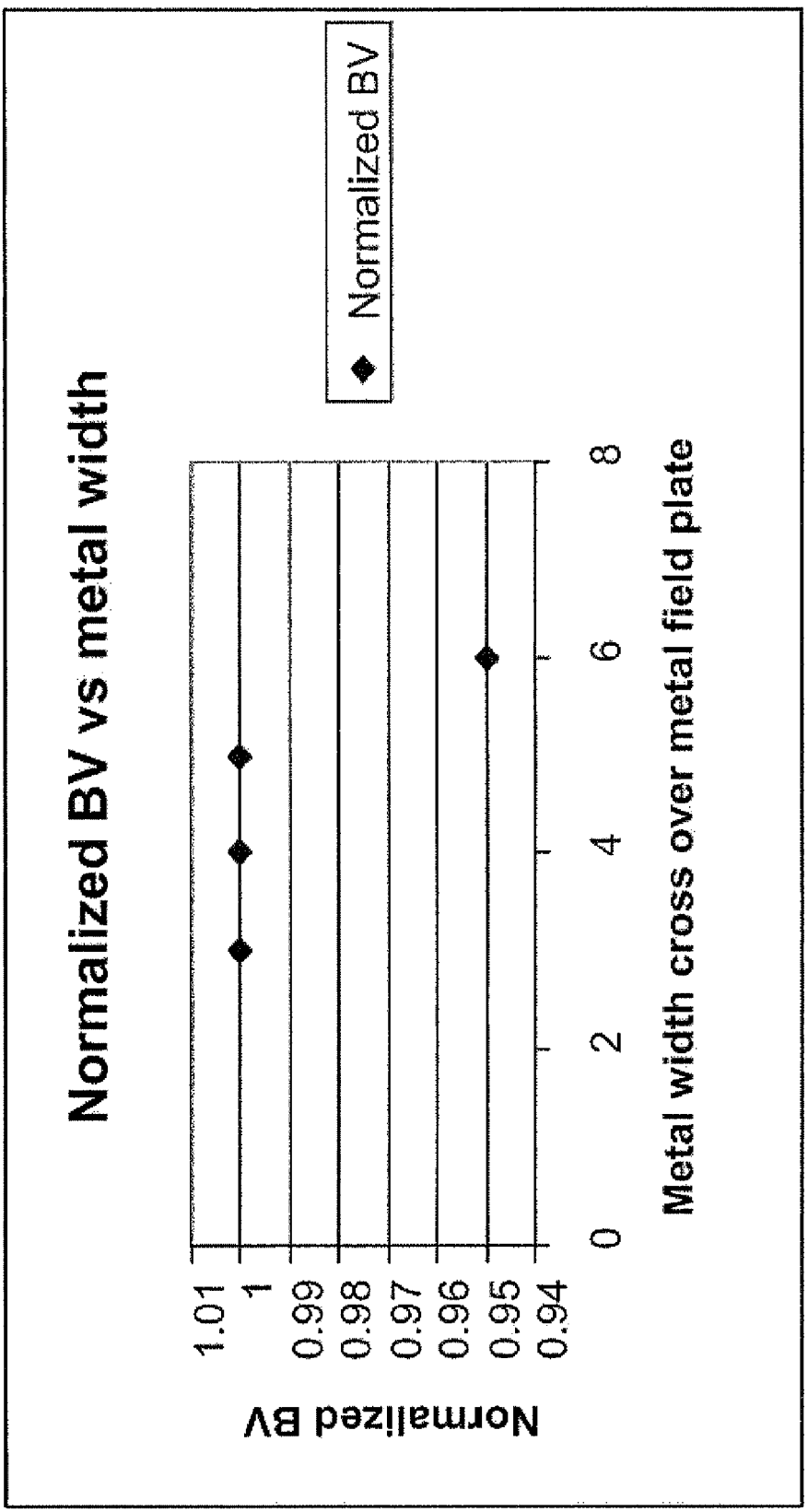
FIG. 3 shows a normalized measurement result of the relationship between the breakdown voltage and the metal width cross over the termination area.

FIG. 3 is a normalized measurement result of the relationship between breakdown voltage and the metal width W cross over the termination area, which shows that breakdown voltage will be degraded when the metal width W of the metal stripes in FIG. 2C is greater than um. It means that the electrical field underneath the metal field plate cannot effectively go through the open area 250 if the metal width W is larger than 5 um.

Figure 4A:
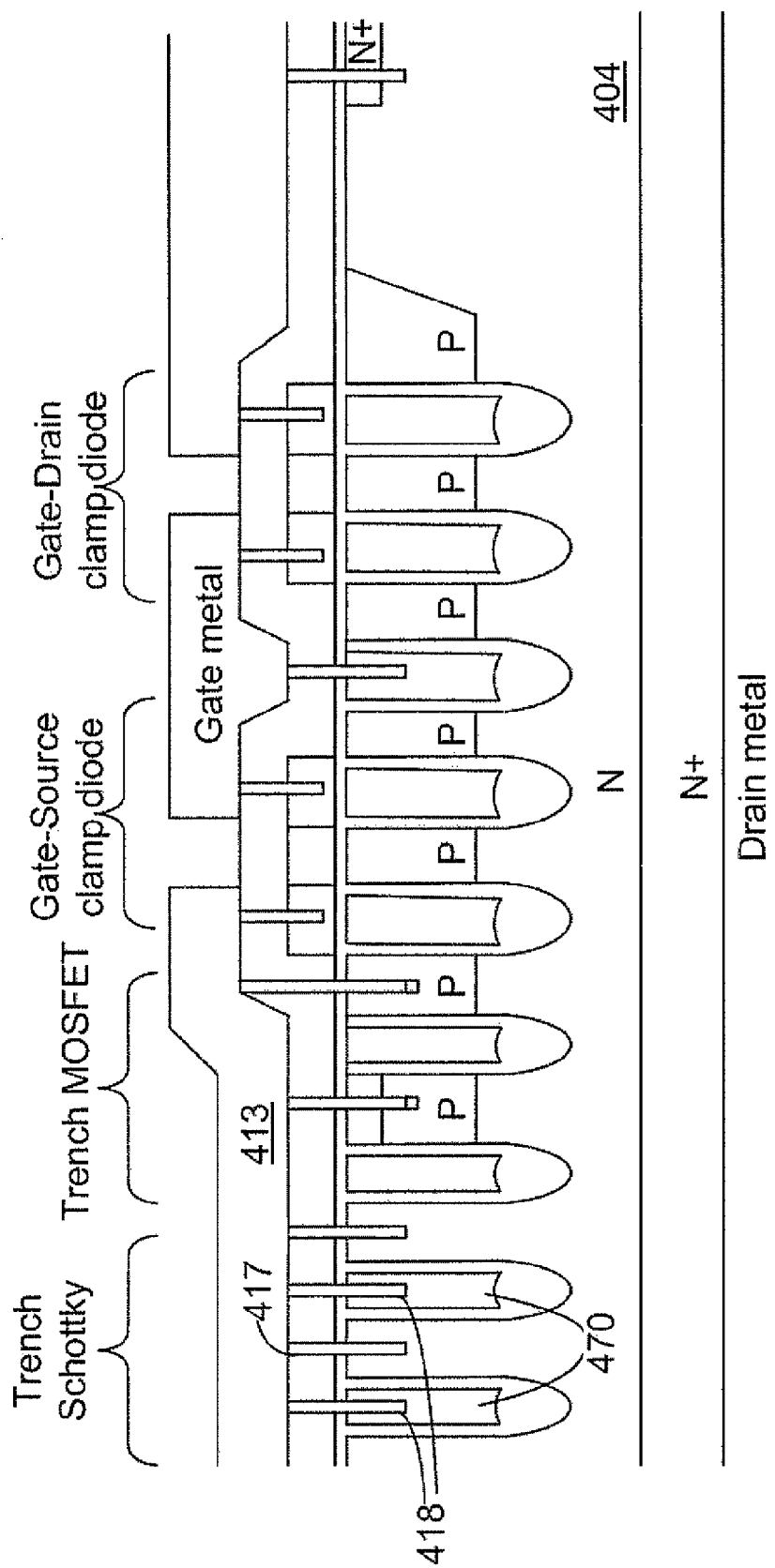
FIG. 4A is another preferred A-B cross-section view of FIG. 2C according to the present invention.

FIG. 4A is another preferred A-B cross-section view of FIG. 2C. The only difference between the structure of FIG. 4A and FIG. 2A is that the embedded Schottky rectifier is a trench Schottky rectifier comprising trenched gates formed in the N epitaxial layer 404 and having same structures of the trenched gates in the trench MOSFET. The trenched anode contact 417 is formed between a pair of the trenched gates where the filling-in conductive material 407 is connected the source metal 413 via a trenched Schottky contact 418 filled with the contact metal plug.

Figure 4B:
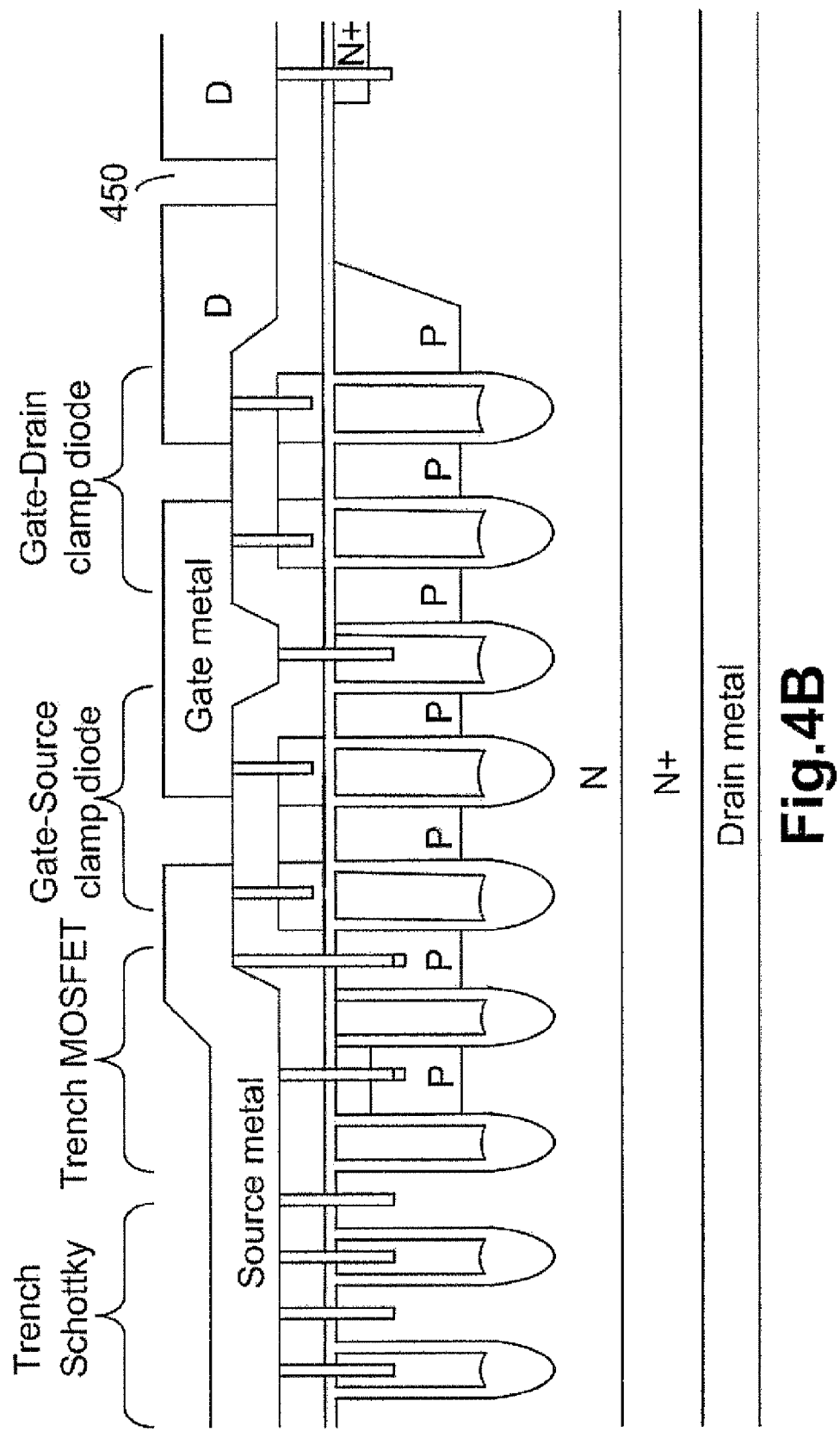
FIG. 4B is another preferred C-D cross-section view of FIG. 2C according to the present invention.

FIG. 4B is another preferred C-D cross-section view of FIG. 2C. The only difference between FIG. 4B and FIG. 4A is that there is an open area 450 of the metal stripes 433 on the top of the termination area.

Figure 5A:
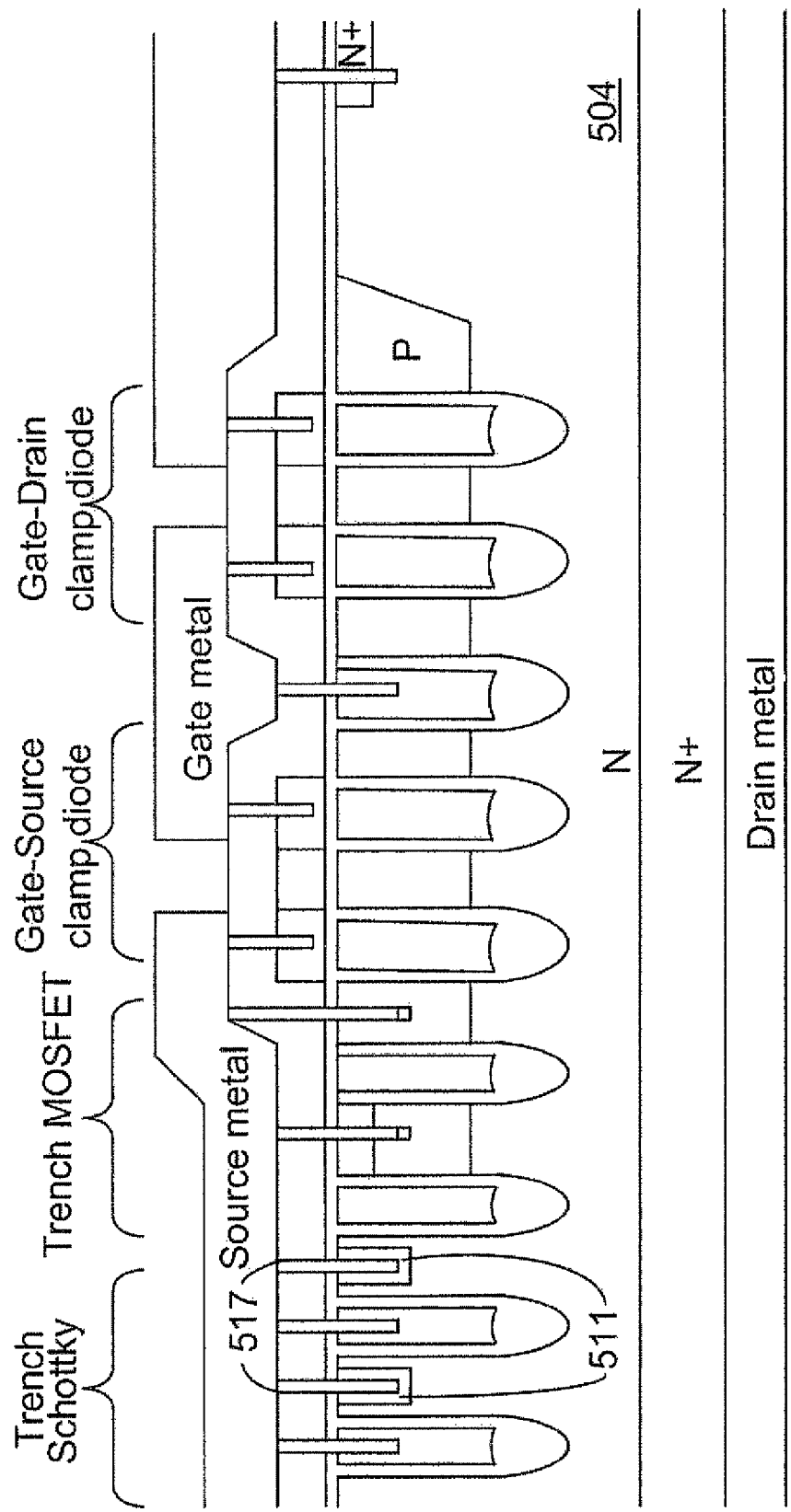
FIG. 5A is another preferred A-B cross-section view of FIG. 2C according to the present invention.

FIG. 5A is another preferred A-B cross-section view of FIG. 2C. The only difference between the structure of FIG. 5A and FIG. 4A is that the trench Schottky rectifier further comprises an N− Schottky barrier height enhancement region 511 surrounding sidewalls and bottom of each the trenched anode contact 517 in the N epitaxial layer 504.

Figure 5B:
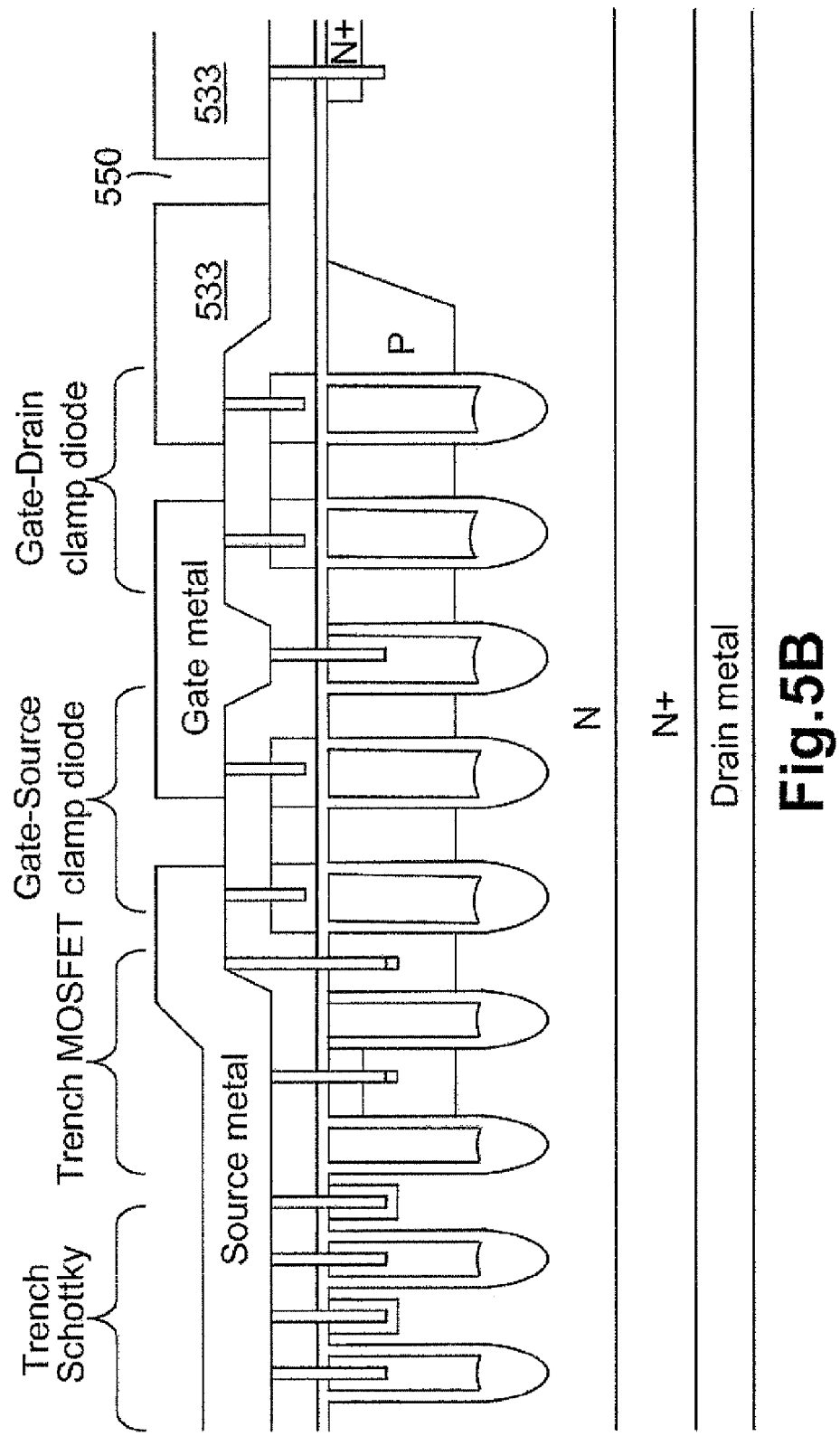
FIG. 5B is another preferred C-D cross-section view of FIG. 2C according to the present invention.

FIG. 5B is another preferred C-D cross-section view of FIG. 2C. The only difference between FIG. 5B and FIG. 5A is that there is an open area 550 of the metal stripes 533 on the top of the termination area.

Figure 6A:
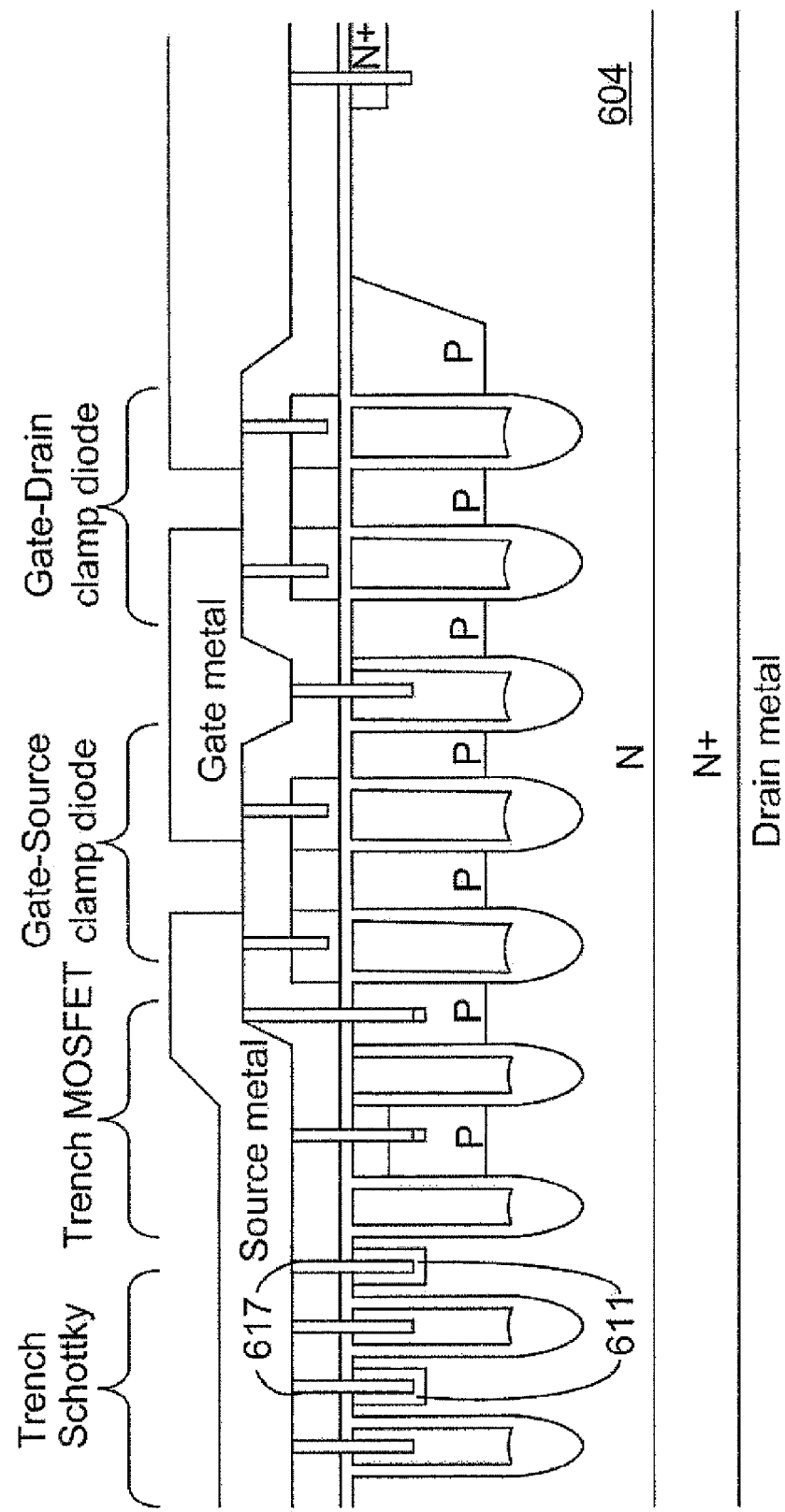
FIG. 6A is another preferred A-B cross-section view of FIG. 2C according to the present invention.

FIG. 6A is another preferred A-B cross-section view of FIG. 2C. The only difference between the structure of FIG. 6A and FIG. 4A is that the trench Schottky rectifier further comprises a P− Schottky barrier height enhancement region 611 surrounding sidewalls and bottom of each the trenched anode contact 617 in the N epitaxial layer 604.

Figure 6B:
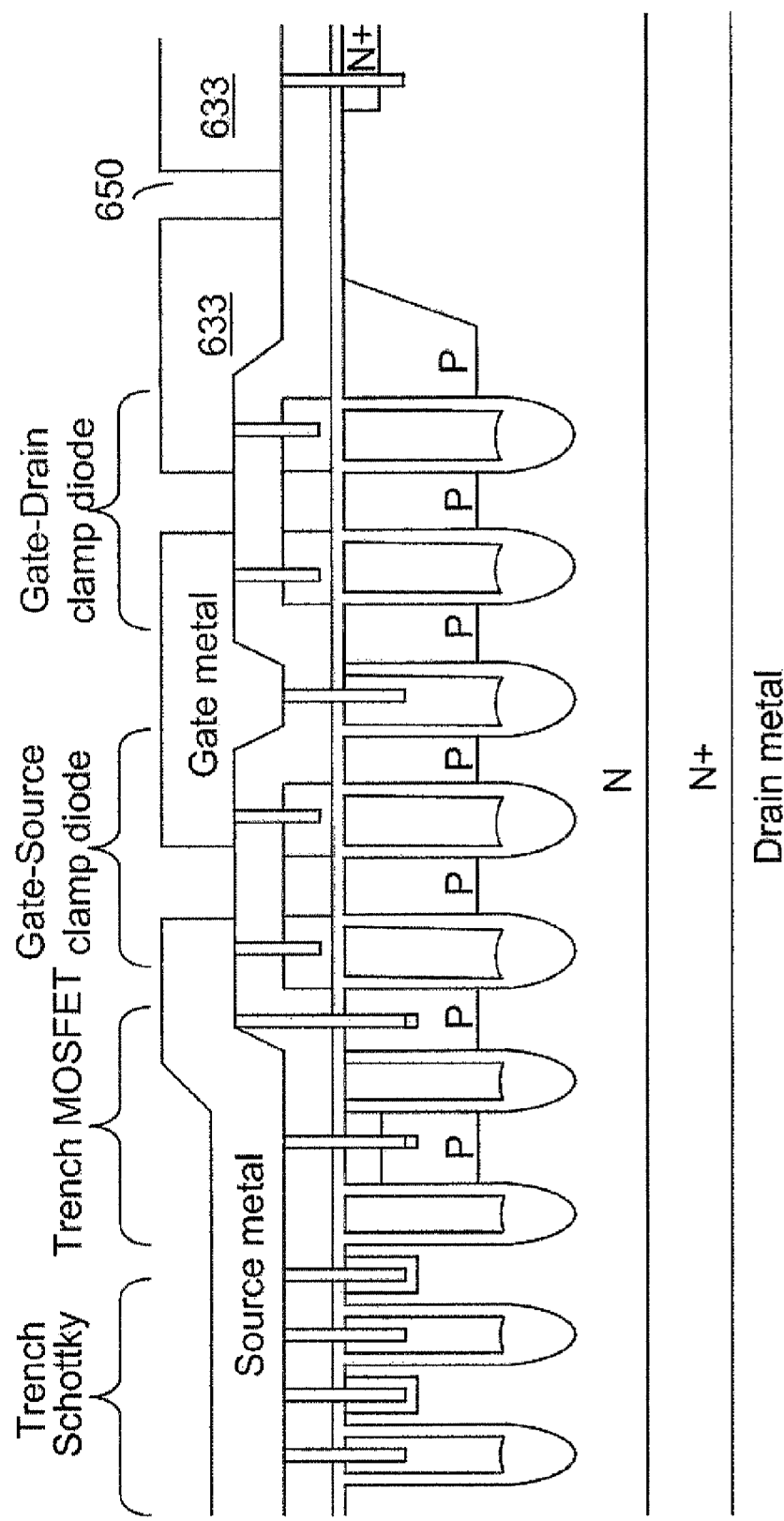
FIG. 6B is another preferred C-D cross-section view of FIG. 2C according to the present invention.

FIG. 6B is another preferred C-D cross-section view of FIG. 2C. The only difference between FIG. 6B and FIG. 6A is that there is an open area 650 of the metal stripes 633 on the top of the termination area.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An integrated circuit comprising:
    a substrate of a first conductivity type;
    an epitaxial layer of said first conductivity type over said substrate, said epitaxial layer having a lower doping concentration than said substrate;
    a trench MOSFET comprising a plurality of trenched gates surrounded by a source region of said first conductivity type encompassed in a body region of a second conductivity type;
    each said trenched gate comprising a conductive material padded by a gate oxide layer filled in a gate trench, wherein said gate oxide layer having a thick bottom oxide on bottom surface of said gate trench with a thickness greater than sidewall oxide along sidewall of said gate trench;
    a Schottky rectifier extending into said epitaxial layer and having a Schottky barrier layer lined in a trenched anode contact filled with a contact metal plug;

a Gate-Drain clamp diode comprising multiple back to back poly-silicon Zener diodes with alternating doped regions of said first conductivity type next to said second conductivity type, connected with a gate metal on one side, and with a drain metal on another side through a plurality of metal stripes cross over a termination area; and a Gate-Source clamp diode comprising multiple back to back poly-silicon Zener diodes with alternating doped regions of said first conductivity type next to said second conductivity type, connected with said gate metal on one side, and with a source metal on another side.

2. The integrated circuit of claim 1 wherein:
said Schottky rectifier being a trench Schottky rectifier having a Schottky barrier layer lined in said trenched anode contact filled with said contact metal plug and between a pair of adjacent said gate trenches.

3. The integrated circuit of claim 1 wherein:
said Schottky rectifier being a Junction Barrier Schottky rectifier having a Schottky barrier layer lined in said trenched anode contact filled with said contact metal plug and between a pair of adjacent said body regions.

4. The integrated circuit of claim 1 wherein:
said Schottky rectifier further comprising a Schottky barrier height enhancement region of said first conductivity type surrounding sidewalls and bottom of each said trenched anode contact in said epitaxial layer, said Schottky barrier height enhancement region having a doping concentration lower than said epitaxial layer.

5. The integrated circuit of claim 1 wherein:
said Schottky rectifier further comprising a Schottky barrier height enhancement region of said second conductivity type surrounding sidewalls and bottom of each said trenched anode contact in said epitaxial layer.

6. The integrated circuit of claim 1 wherein:
said Gate-Source clamp diode being connected to said source metal through a first trenched diode contact filled with said contact metal plug while being connected to said gate metal through a second trenched diode contact filled with said contact metal plug, said Gate-Drain clamp diode being connected to said gate metal through a third trenched diode contact filled with said contact metal plug while being connected to said drain metal through a forth trenched diode contact filled with said contact metal plug.

7. The integrated circuit of claim 6 further comprising an etch-buffer trenched gate in said epitaxial layer and underneath each of said first, second, third and forth trenched diode contacts, said etch-buffer trenched gate having same structure of said trenched gates in said trench MOSFET and serving as buffer layer for prevention of gate-body shortage.

8. An integrated circuit comprising:
a substrate of a first conductivity type;
an epitaxial layer of said first conductivity type over said substrate, said epitaxial layer having a lower doping concentration than said substrate;
a trench MOSFET comprising a plurality of trenched gates surrounded by a source region of said first conductivity type encompassed in a body region of a second conductivity type;
each said trenched gate comprising a conductive material padded by a gate oxide layer filled in a gate trench, wherein said gate oxide layer having a thick bottom oxide on bottom surface of said gate trench with a thickness greater than sidewall oxide along sidewall of said gate trench;

a Schottky rectifier extending into said epitaxial layer and having a Schottky barrier layer lined in a trenched anode contact filled with a contact metal plug; and a Gate-Source clamp diode comprising multiple back to back poly-silicon Zener diodes with alternating doped regions of said first conductivity type next to said second conductivity type, connected with a gate metal on one side, and with a source metal on another side.

9. The integrated circuits of claim 8 wherein:
said the Schottky rectifier being trench Schottky rectifier having a Schottky barrier layer lined in said trenched anode contact filled with said contact metal plug and between a pair of adjacent said gate trenches.

10. The integrated circuits of claim 8 wherein:
said the Schottky rectifier being Junction Barrier Schottky rectifier having a Schottky barrier layer lined in said trenched anode contact filled with said contact metal plug and between a pair of adjacent said body regions.

11. The integrated circuits of claim 8 wherein:
said Schottky rectifier further comprising a Schottky barrier height enhancement region of said first conductivity type surrounding sidewalls and bottom of each said trenched anode contact in said epitaxial layer, said Schottky barrier height enhancement region having a doping concentration lower than said epitaxial layer.

12. The integrated circuits of claim 8 wherein:
said Schottky rectifier further comprising a Schottky barrier height enhancement region of said second conductivity type surrounding sidewalls and bottom of each said trenched anode contact in said epitaxial layer.

13. The integrated circuit of claim 8 wherein:
said Gate-Source clamp diode being connected to said source metal through a first trenched diode contact filled with said contact metal plug while being connected to said gate metal through a second trenched diode contact filled with said contact metal plug.

14. The integrated circuits of claim 13 further comprising an etch-buffer trenched gate in said epitaxial layer and underneath each of said first and second trenched diode contacts, said etch-buffer trenched gate having same structure of said trenched gates in said trench MOSFET and serving as buffer layer for prevention of gate-body shortage.

15. An integrated circuit comprising:
a substrate of a first conductivity type;
an epitaxial layer of said first conductivity type over said substrate, said epitaxial layer having a lower doping concentration than said substrate;
a trench MOSFET comprising a plurality of trenched gates surrounded by a source region of said first conductivity type encompassed in a body region of a second conductivity type;
each said trenched gate comprising a conductive material padded by a gate oxide layer filled in a gate trench, wherein said gate oxide layer having a thick bottom oxide on bottom surface of said gate trench with a thickness greater than sidewall oxide along sidewall of said gate trench;
a Schottky rectifier extending into said epitaxial layer and having a Schottky barrier layer lined in a trenched anode contact filled with a contact metal plug; and
a Gate-Drain clamp diode comprising multiple back to back poly-silicon Zener diodes with alternating doped regions of said first conductivity type next to said second conductivity type, connected with a gate metal on one side, and with a drain metal on another side through a plurality of metal stripes cross over a termination area.

16. The integrated circuits of claim 15 wherein:
said the Schottky rectifier being trench Schottky rectifier having a Schottky barrier layer lined in said trenched anode contact filled with said contact metal plug and between a pair of adjacent said gate trenches.

17. The integrated circuits of claim 15 wherein:
said the Schottky rectifier being Junction Barrier Schottky rectifier having a Schottky barrier layer lined in said trenched anode contact filled with said contact metal plug and between a pair of adjacent said body regions.

18. The integrated circuits of claim 15 wherein:
said Schottky rectifier further comprising a Schottky barrier height enhancement region of said first conductivity type surrounding sidewalls and bottom of each said trenched anode contact in said epitaxial layer, said Schottky barrier height enhancement region having a doping concentration lower than said epitaxial layer.

19. The integrated circuits of claim 15 wherein:
said Schottky rectifier further comprising a Schottky barrier height enhancement region of said second conductivity type surrounding sidewalls and bottom of each said trenched anode contact in said epitaxial layer.

20. The integrated circuit of claim 15 wherein:
said Gate-Drain clamp diode being connected to said gate metal through a first trenched diode contact filled with said contact metal plug while being connected to said drain metal through a second trenched diode contact filled with said contact metal plug.

21. The integrated circuits of claim 20 further comprising an etch-buffer trenched gate in said epitaxial layer and underneath each of said first and second trenched diode contacts, said etch-buffer trenched gate having same structure of said trenched gates in said trench MOSFET and serving as buffer layer for prevention of gate-body shortage.

22. An integrated circuit comprising:
a substrate of a first conductivity type;
an epitaxial layer of said first conductivity type over said substrate, said epitaxial layer having a lower doping concentration than said substrate;
a trench MOSFET comprising a plurality of trenched gates surrounded by a source region of said first conductivity type encompassed in a body region of a second conductivity type;
each said trenched gate comprising a conductive material padded by a gate oxide layer filled in a gate trench, wherein said gate oxide layer having a thick bottom oxide on bottom surface of said gate trench with a thickness greater than sidewall oxide along sidewall of said gate trench;
a Gate-Drain clamp diode comprising multiple back to back poly-silicon Zener diodes with alternating doped regions of said first conductivity type next to said second conductivity type, connected with a gate metal on one side, and with a drain metal on another side through a plurality of metal stripes cross over a termination area; and
a Gate-Source clamp diode comprising multiple back to back poly-silicon Zener diodes with alternating doped regions of said first conductivity type next to said second conductivity type, connected with said gate metal on one side, and with a source metal on another side.

23. The integrated circuit of claim 1 wherein:
said Gate-Source clamp diode being connected to said source metal through a first trenched diode contact filled with said contact metal plug while being connected to said gate metal through a second trenched diode contact filled with said contact metal plug, said Gate-Drain clamp diode being connected to said gate metal through a third trenched diode contact filled with said contact metal plug while being connected to said drain metal through a forth trenched diode contact filled with said contact metal plug.

24. The integrated circuits of claim 23 further comprising an etch-buffer trenched gate in said epitaxial layer and underneath each of said first, second, third and forth trenched diode contacts, said etch-buffer trenched gate having same structure of said trenched gates in said trench MOSFET and serving as buffer layer for prevention of gate-body shortage.

25. An integrated circuit comprising:
a substrate of a first conductivity type;
an epitaxial layer of said first conductivity type over said substrate, said epitaxial layer having a lower doping concentration than said substrate;
a trench MOSFET comprising a plurality of trenched gates surrounded by a source region of said first conductivity type encompassed in a body region of a second conductivity type;
each said trenched gate comprising a conductive material padded by a gate oxide layer filled in a gate trench, wherein said gate oxide layer having a thick bottom oxide on bottom surface of said gate trench with a thickness greater than sidewall oxide along sidewall of said gate trench;
a Gate-Source clamp diode comprising multiple back to back poly-silicon Zener diode with alternating doped regions of said first conductivity type next to said second conductivity type, connected with a gate metal on one side, and with a source on another side.

26. The integrated circuit of claim 25 wherein:
said Gate-Source clamp diode being connected to said source metal through a first trenched diode contact filled with said contact metal plug while being connected to said gate metal through a second trenched diode contact filled with said contact metal plug.

27. The integrated circuit of claim 26 further comprising an etch-buffer trenched gate in said epitaxial layer and underneath each of said first and second trenched diode contacts, said etch-buffer trenched gate having same structure of said trenched gates in said trench MOSFET and serving as buffer layer for prevention of gate-body shortage.

28. An integrated circuit comprising:
a substrate of a first conductivity type;
an epitaxial layer of said first conductivity type over said substrate, said epitaxial layer having a lower doping concentration than said substrate;
a trench MOSFET comprising a plurality of trenched gates surrounded by a source region of said first conductivity type encompassed in a body region of a second conductivity type;
each said trenched gate comprising a conductive material padded by a gate oxide layer filled in a gate trench, wherein said gate oxide layer having a thick bottom oxide on bottom surface of said gate trench with a thickness greater than sidewall oxide along sidewall of said gate trench;
a Gate-Drain clamp diode comprising multiple back to back poly-silicon Zener diodes with alternating doped regions of said first conductivity type next to said second conductivity type, connected with a gate metal on one side, and with a drain metal on another side through a plurality of metal stripes cross over a termination area.

29. The integrated circuit of claim 15 wherein:
said Gate-Drain clamp diode being connected to said gate metal through a first trenched diode contact filled with said contact metal plug while being connected to said drain metal through a second trenched diode contact filled with said contact metal plug.

30. The integrated circuits of claim 29 further comprising an etch-buffer trenched gate in said epitaxial layer and underneath each of said first and second trenched diode contacts, said etch-buffer trenched gate having same structure of said trenched gates in said trench MOSFET and serving as buffer layer for prevention of gate-body shortage.

* * * * *